METHOD OF ADJUSTING DIRECT-CURRENT AMPLIFIER TO ACHIEVE SUBSTANTIALLY ZERO TEMPERATURE DRIFT COEFFICIENT

Filed Aug. 27, 1962 2 Sheets-Sheet 1

NORMAN C. WALKER
JAMES A. NELSON
INVENTORS

BY Nilsson & Robbins
ATTORNEYS

METHOD OF ADJUSTING DIRECT-CURRENT AMPLIFIER TO ACHIEVE SUBSTANTIALLY ZERO TEMPERATURE DRIFT COEFFICIENT

Filed Aug. 27, 1962 2 Sheets-Sheet 2

NORMAN C. WALKER
JAMES A. NELSON
INVENTORS

BY Nilsson & Robbins
ATTORNEYS 3,185,932

METHOD OF ADJUSTING DIRECT-CURRENT AMPLIFIER TO ACHIEVE SUBSTANTIALLY ZERO TEMPERATURE DRIFT COEFFICIENT

Norman C. Walker and James A. Nelson, San Diego, Calif., assignors to Dana Laboratories, Inc., Santa Ana, Calif., a corporation of California Filed Aug. 27, 1962, Ser. No. 219,592
5 Claims. (Cl. 330—12)

This invention relates to direct current amplifiers and more particularly to direct current amplifiers using transistors as active circuit elements in which the normally expected error resulting from changes in base-emitter voltage with ambient temperature variation has been substantially eliminated.

The direct current amplifiers in accordance with the present invention are utilizable in any application within which there is a direct current input signal. However these amplifiers find particularly excellent utilization in those applications wherein the direct current input signal is of relatively low level such as in instrumentation or the like. Therefore the description of the present invention will be given with particular reference to such low level input signal utilization although it is to be expressly understood that the scope of the present invention is not to be limited thereby.

In the prior art there was an initial attempt to utilize direct current amplifiers in those applications where low level input signals were present. For the most part such amplifiers did not meet the required specifications established for the desirable level of utilization at that particular time and as a result chopper stablized amplifiers were developed for use with such signals. Such chopper stabilized amplifiers predominantly utilized a mechanical type chopper to convert the direct current low level input signal into an alternating current signal which could then be amplified and provide the desired intelligence. Although the chopper stabilized amplifiers proved to be quite successful from an operational point of view, other problems were introduced such as increased expense, slow overload recovery, chopper intermodulation, and reduced lifetime. For example, most typical mechanical choppers if utilized continuously would have an expected lifetime of a maximum of nine months.

In addition thereto mechanical choppers introduce additional weight and size which is undesirable in many applications. In an attempt to overcome some of the disadvantages of the mechanical chopper, electronic choppers utilizing transistors as the active circuit elements were introduced into the prior art. Although the transistor chopper did overcome the mechanical limitations of the previously utilized choppers, the slow overload recovery and intermodulation disadvantages still existed.

As a result of the foregoing problems, it has been highly desirable to provide a direct current amplifier and particularly one utilizing transistors that would meet the required conditions during operation. However one of the greatest problems existing with respect to the utilization of transistors, particularly in low level input signal direct current amplifiers is the inherent instability of transistors when subjected to variations in ambient temperature. This instability is evidenced particularly in the variation of the voltage drop between the base and emitter ($V_{BE}$) of all transistors. Recent advances in the technology of transistor manufacture have assisted in reducing some of these inherent instabilities within various transistors. This is particularly true with respect to the recently developed planar double-diffused transistors.

As a result of this advance in the art in the transistor manufacturing technology several attempts have been recently made to utilize these advantages in a direct current amplifier having the desired criterion for handling low level input signals. Evidences of these attempts are found in such publications as "Differential Amplifier With Regulator Achieves High Stability, Low Drift," by R. D. Middlebrook and A. D. Taylor, Electronics, July 28, 1961, page 56; "A New D.C. Transistor Differential Amplifier," by David F. Hilbiber, a paper presented at Solid State Circuits Conference in Philadelphia, Pennsylvania, February 15, 1961; and "Drift Considerations in Low-Level Direct-Coupled Transistor Circuits," by J. R. Biard and W. T. Matzen, available from Texas Instruments, Incorporated, Dallas, Texas.

In each instance great emphasis is placed upon the problem of the change in base-emitter voltage with respect to temperature of these circuits. The solutions to the problems in each instance is to very closely match the characteristics of the two transistors utilized in the input stage, to maintain these two transistors at the same temperature by housing them with an internal heater and by using an external temperature-compensating circuit which overcomes the drift resulting from changes in ambient temperature.

While each of the suggestions offered by the various publications above referred to, operate quite well within certain limitations, it can readily be seen that large expense is incurred in obtaining the matched transistors. Additional space and power is consumed, both in providing the external circuit for temperature compensation and in providing the internal heater.

Accordingly, it is an object of the present invention to provide a direct current amplifier which overcomes disadvantages of the prior art direct current amplifiers, but at the same time minimizes costs, and eliminates the necessity for complex calculations and adjustments heretofore required to produce reliable operations.

It is another object of the present invention to provide a direct current amplifier capable of utilization with low level input signals which utilizes transistors as the active circuit elements thereof, but which substantially reduces error signals without the utilization of external temperature compensation networks.

It is another object of the present invention to provide a direct current amplifier for utilization with low level input signals which eliminates close matching of transistors or, if transistors are matched, greatly enhances the operation of the circuit.

It is another object of the present invention to provide a method for adjusting a dual transistor input stage for a direct current amplifier which is simple, efficient, and inexpensive.

Additional objects and advantages of the present invention both as to its organization and method of operation will be readily understood from a reading of the following description taken in conjunction with the accompanying drawings which are presented by way of example only and are not intended as a limitation upon the scope of the present invention as defined in the appended claims and in which:

A direct current amplifier in accordance with the present invention includes an input stage which comprises two transistors, each having an emitter, a collector and a base. Input signal sources are connected to each of the bases of the two transistors. The collectors and the emitters of the two transistors are respectively connected through means to a point of fixed potential in such a manner that a first current flow path is provided through one of the transistors while a second current flow path is provided through the other of the two transistors. Means is provided for varying the current flowing through one of the current paths with respect to the other current path, that is, to vary the ratio of the currents flowing in the current paths, thereby to cause the voltage appearing between the base and emitter of each of the two transistors to be substantially equal.

In accordance with the method of the present invention there is provided a transistor direct current amplifier having as an input stage therefor two transistors interconnected in such a manner that a current-flow path is provided through each of the transistors. The emitters of the two transistors are interconnected and a common input signal is applied to the bases of the two transistors. Alternatively the bases of the two transistors may be interconnected. The current flowing through one of the paths is then varied relative to the current flowing through the other path and the voltage appearing at each of the collectors of the two transistors is caused to become substantially equal.

Figure 1:
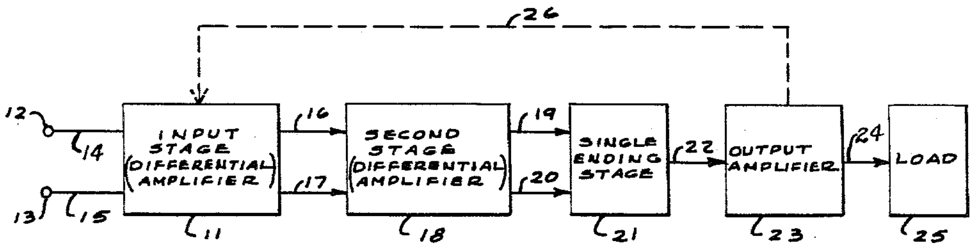
FIG. 1 is a block diagram of a direct current amplifier in accordance with the present invention.

Referring now to the drawings and more particularly to FIG. 1 thereof, there is illustrated a diagram in block form of a direct current amplifier in accordance with the present invention. As is therein illustrated, there is provided an input stage 11 which preferably is a differential amplifier. A pair of terminals 12 and 13 are interconnected respectively by leads 14 and 15 to apply input signals to the input stage 11. The output signals from the input stage 11 are interconnected by way of leads 16 and 17 to a second stage 18 which preferably is also a differential amplifier. The output of the second stage is applied by way of leads 19 and 20 to a single ending stage 21. The single ending stage 21 is utilized to convert the two signals which are present at the output of the second stage 18 into a single signal that may then be amplified for further utilization.

The output from the single ending stage 21 is applied by way of lead 22 to an output amplifier 23. The output amplifier is utilized to amplify the signal appearing from the single ending stage 22 for further application to a desired load which is indicated by the block 25 which is interconnected by way of lead 24 to the output amplifier 23. Under some applications it has been found desirable to utilize a portion of the output signal by way of a feedback signal to the input stage 11. Such utilization is indicated by the dotted line 26. Under some circumstances where a feedback signal is thus applied to the input stage it is utilized either as one of the input signals or may be applied to the emitter circuit of the input stage 11.

It has been found that by properly adjusting the current flow within the input stage 11 of a direct current amplifier in accordance with the present invention the error signals resulting from the inherent temperature instability of the transistor characteristics can be eliminated. A typical input stage interconnected in such a manner as to accomplish these adjustments is illustrated in FIG. 2, to which reference is hereby made.

Figure 2:
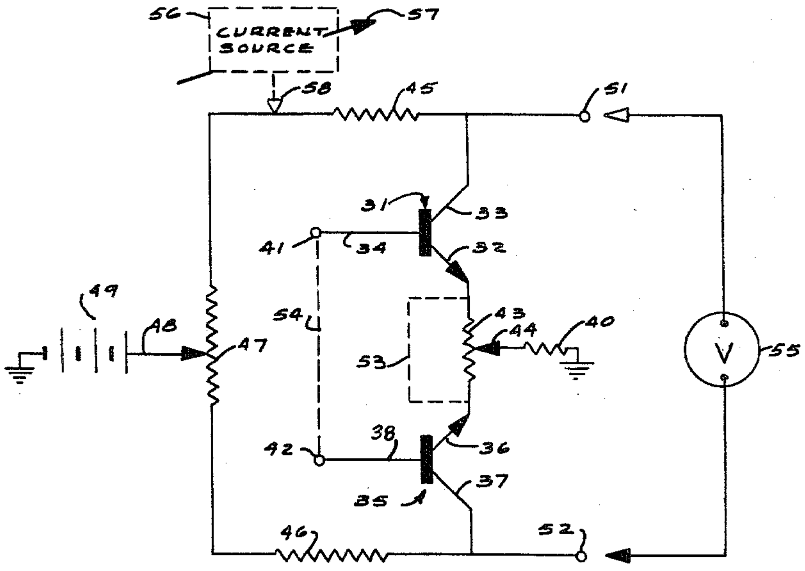
FIG. 2 is a schematic diagram of an input stage for a direct current amplifier in accordance with the present invention.

As is illustrated in the schematic diagram of FIG. 2 the input stage consists of a transistor 31 having an emitter 32, a collector 33 and a base 34, and also a transistor 35 having an emitter 36, a collector 37, and a base 38. The bases 34 and 38 of the transistors 31 and 35 are respectively interconnected to input terminals 41 and 42 to which input signals are applied. Means is provided for interconnecting the emitters of the two transistors 31 and 35 and in the presently preferred embodiment of the present invention this means comprises the resistive element 43 of a potentiometer. The movable arm 44 of the potentiometer is returned through a resistor 40 to a point of fixed potential such as ground. The resistor 40 may be replaced if desired by a constant current generator thereby to maintain the sum of the currents flowing through transistors 31 and 35 constant. A load resistor 45 is connected between the collector 33 of the transistor 31 and one terminal of the resistance element 47 of a second potentiometer. A load resistor 46 is interconnected between the collector 37 of the transistor 35 and the opposite terminal of the resistive element 47. The movable arm 48 of the potentiometer which makes contact with the resistance element 47 is connected to a point of fixed potential such as the positive terminal of the battery 49, the negative terminal of which is returned to ground. Output terminals 51 and 52 are connected respectively to the collectors 33 and 37 of the transistors 31 and 35.

Through the interconnection of the transistors and the various other circuit elements as illustrated in FIG. 2, it can readily be seen that a first current flow path is provided through transistor 31 from ground through the battery 49, the upper portion of the resistive element 47 of the potentiometer through the load resistor 45, the collector and emitter of the transistor 31 through the upper portion of the resistive element 43 through the movable arm 44, the resistor 40, and back to ground. A second current flow path can also be traced through the transistor 35 in a similar manner starting with the battery 49 through the lower portion of the resistive element 47, the load resistor 46, the collector 37 and the emitter 36 of the transistor 35, through the lower portion of the resistive element 43, the movable arm 44, the resistor 40, and back to ground. It should be noted that the potentiometer consisting of the resistive element 47 and the movable arm 48 is utilized to permit variation of the current through one of the current paths so as to permit a different current to flow through one current path relative to the other while maintaining no voltage difference between terminals 51 and 52. The purpose of this variation of current will now be described.

As has above been pointed out one of the basic problems inherent within a direct current amplifier utilizing transistors as the active circuit elements thereof, is the variation of the voltage drop from base to emitter of the transistors in response to the variation in ambient temperatures. When utilizing a differential amplifier, any difference in the voltage drop from base to emitter of the two transistors provides an output signal for example at terminals 51, 52. Subsequent stages of amplification as above illustrated in FIG. 1 cannot discern between such an error signal and an actual output signal. It has been discovered that if the voltage drop between the base and emitter of each of the two transistors is established under quiescent operating conditions, such that they are substantially equal ($V_{BE1}=V_{BE2}$), then they will remain substantially equal throughout the entire operating range of the amplifier. Another way of stating the same principle is that if the difference between the base-emitter voltage drop of the two transistors in a dual transistor input stage is established such that it is substantially equal to zero ($V_{BE1}-V_{BE2}=0$), then it will remain substantially equal to zero throughout the entire temperature operating range of the amplifier. This being the case, it can readily be seen therefore that no output signal will appear at the terminals 51, 52 of the input stage illustrated in FIG. 2, as a result of the variations in the base-emitter voltage drop in response to temperature change.

To accomplish the establishment of this condition of operation, the following procedure should be carried out. Emitter 32 of transistor 31 is connected to emitter 36 of transistor 35 as is indicated by the dotted line 53. If as is the case under some conditions of operation these two emitters are directly interconnected, then this step obviously may be eliminated. Secondly, identical input signals are applied to input terminals 41 and 42, or alternatively the bases 34 and 38 of the transistors 31 and 35 respectively may be directly interconnected as is illustrated by the dotted line 54. A meter such as is illustrated by the voltmeter 55 is then connected to output terminals 51 and 52. The movable arm 48 is then adjusted upon the resistance element 47 of the potentiometer until the reading of the meter 55 is zero. Any difference in base-emitter voltage drops between the two transistors is equalized by varying the current flowing through the two transistors under quiescent operating conditions. In this manner the above condition has then been satisfied. That is, the difference between the base-emitter voltage drops of the two transistors has been intentionally established as zero.

Under most operating conditions, particularly of a differential amplifier input stage to a direct current amplifier such as that in accordance with the present invention it is desirable to provide a feedback signal for various purposes. Under such conditions it is often desirable to interconnect a resistance element between the emitters of the two transistors in the input stage. Under such conditions the variation in resistance in the emitter circuits of the two transistors causes the current flowing through the two current paths to become unbalanced. This unbalance in current also creates an erroneous output signal or in other words an error signal. To eliminate the possibility of the resistance in the emitter circuits which has been externally applied from creating such an erroneous signal the interconnection directly between the emitters 32 and 36 of the transistors 31 and 35 as illustrated by the dashed line 53 may next be removed. At this point the meter 55 may show an output signal, even though the bases of the two transistors are interconnected by the lead 54 connected between the terminals 41 and 42. At this point the movable arm 44 may be adjusted upon the resistance element 43 until the output of the meter 55 once again reads zero. In this manner then the input stage has been adjusted so that no erroneous output signal is created as a result of a difference in the base-emitter voltage drops or as a result of the difference in the resistance appearing in the emitter circuits of the two transistors.

It has been found that once an input stage has been adjusted as above set forth the difference between the voltage drops across the base and emitter of each of the transistors remains substantially at zero throughout the entire operating temperature range of the direct current amplifier. Therefore the previous problems of drift resulting from temperature variation are substantially eliminated.

Although a variable resistor or potentiometer has been illustrated as the means for varying the current within one of the current flow paths relative to the other in order to accomplish the foregoing result, it should be expressly understood that other devices may be utilized to accomplish the same purpose. For example, a current source such as is illustrated at 56 and which is variable as indicated by the arrow 57 may be connected to the first or to the second current path, as may be desired, and as indicated by the dashed line 58 interconnected to the first current flow path through the transistor 31. Current may then be supplied from the current source 56 until the meter 55 reads zero after the procedures above indicated have been carried out.

Figure 3:
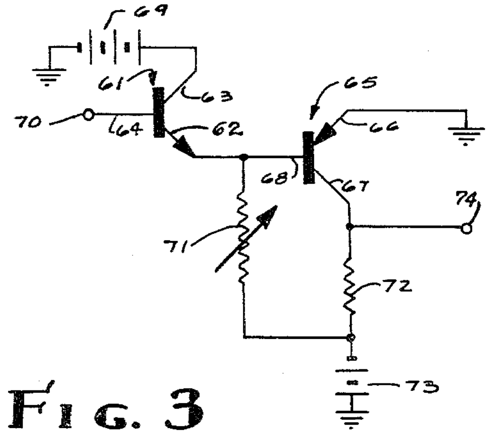
FIG. 3 is a schematic circuit diagram of an alternative embodiment of an input stage for a direct current amplifier in accordance with the present invention.

Although the above description has been given with respect to the use of a differential amplifier as the input stage it should be expressly understood that single ended input stages may also be utilized in accordance with the principles of the present invention. For example, as is illustrated in FIG. 3 to which reference hereby is made, a dual transistor input stage may consist of a transistor 61 having an emitter 62, a collector 63, and a base 64, and also a transistor 65 having an emitter 66, a collector 67, and a base 68. The collector 63 of the transistor 61 is connected to a point of fixed potential such as the positive terminal of battery 69 the negative terminal of which is connected to ground. The base 64 is connected to an input terminal 70 to which input signals are applied to the input stage of the amplifier. The emitter 62 of the transistor 61 is returned to a point of fixed potential such as the negative terminal of the battery 73 through a variable resistor 71. The emitter 62 is also directly connected to the base 68 of the transistor 65. The emitter 66 of the transistor 65 is connected to a point of fixed potential which is the same as the reference for the input terminals 70 and in this example is ground. A resistor 72 is connected between the collector 67 of the transistor 65 and the negative terminal of the battery 73, the positive terminal of which is connected to ground. An output terminal 74 is also connected to the collector 67.

As can be seen from the schematic circuit diagram in FIG. 3, two current flow paths are provided in the input stage. The first of the current flow paths can be viewed from ground through the battery 69, the collector and emitter of transistor 61, variable resistor 71, battery 73 and back to ground. The second current flow path can be viewed as being from ground through the emitter and collector of the transistor 65, the load resistor 72, the battery 73, and back to ground. As can also be seen, if the base-emitter voltage drop of each of the two transistors 61 and 65 is not equal, then an error signal appears at the output terminal 74. If, however, the voltage drop across the base to emitter of each of the two transistors can be established as being equal so that the difference between them is substantially zero, then no error signal will be thus developed throughout the normal operating temperature range of the amplifier. The emitter-base voltage drops of the two transistors can be set during quiescent operating conditions in a manner similar to that described above with respect to the circuit of FIG. 2 so that they will be substantially equal and therefore their difference substantially zero. The setting of the base-emitter voltage drops to substantially the same value is accomplished by varying the variable resistor 71 connected in the first current flow path. By varying the variable resistor 71 the current flowing through the first current flow path is varied relative to the current flowing through the second current flow path until that point is reached at which the output signal is at a predetermined level, the value of which is indicative of zero during the time that the input signal applied to the terminal 70 is zero.

When using a single ended input stage such as that illustrated in FIG. 3 it should become obvious that the second stage of the amplifier as illustrated in FIG. 1 would not be a differential amplifier, nor would the third stage necessarily be a single ending stage. In short, the second and single ending stages could be viewed as intermediate stages of amplification for the output signal from the input stage as illustrated in FIG. 3.

Figure 4:
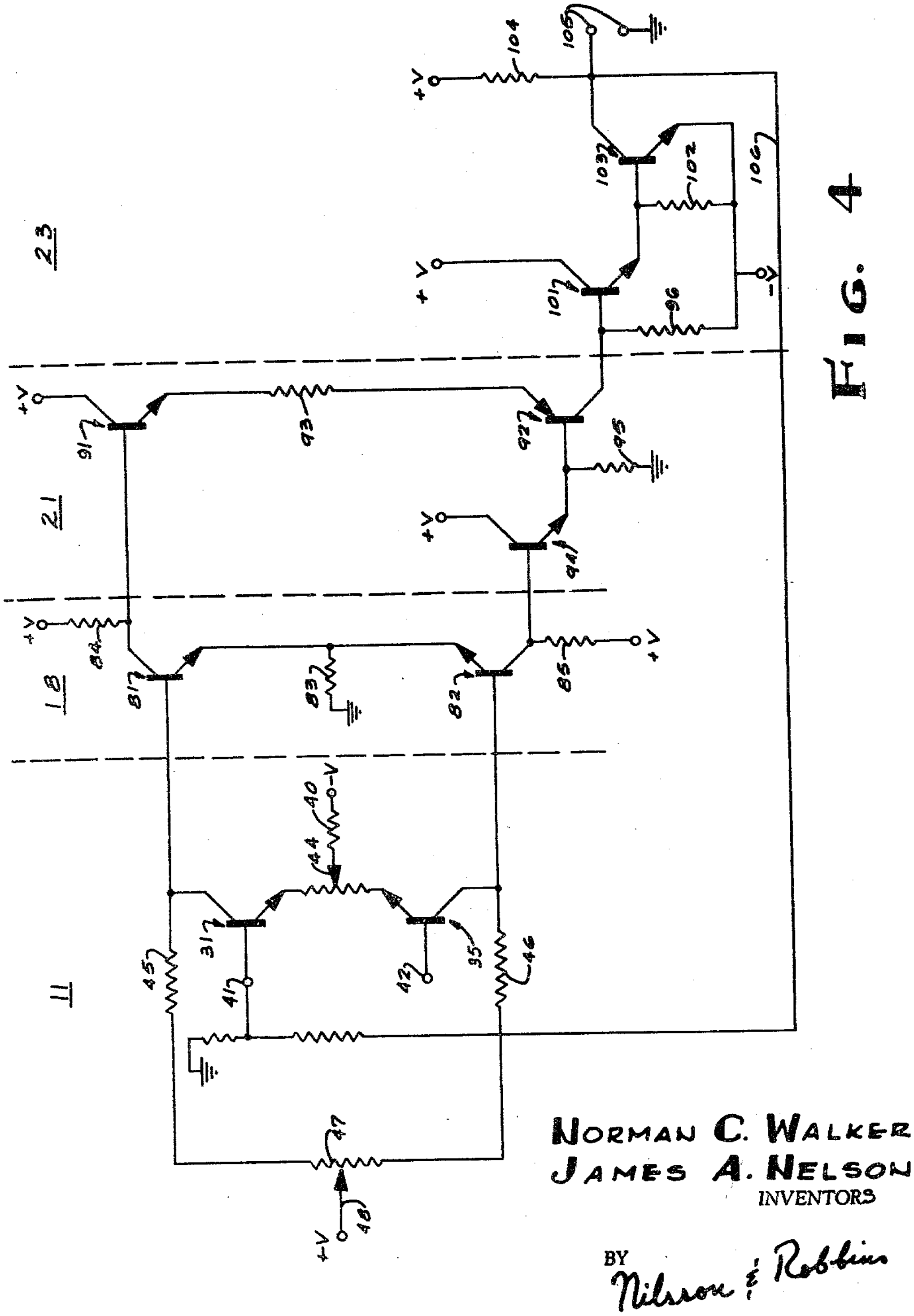
FIG. 4 is a schematic circuit diagram of a preferred embodiment of a direct current amplifier in accordance with the present invention.

Referring now more particularly to FIG. 4 there is schematically illustrated a direct current amplifier utilizing the principles of the present invention. As is therein illustrated each of the various stages referred to during the description of FIG. 1 is indicated by being separated by the dashed lines and by utilizing the same reference numeral for each stage as is illustrated in FIG. 1. The input stage is identical to the circuit illustrated in FIG. 2, as is indicated by utilization of the same reference numerals. No further description will be given with respect to the input stage 11. The second stage 18 is a standard differential amplifier utilizing a pair of transistors 81 and 82. The emitters of the two transistors are directly connected together and are returned by way of a common resistor 83 to a point of fixed potential such as ground. A load resistor 84 is connected between the collector of transistor 81 and a source of voltage indicated as +V while the collector of the transistor 82 is returned through a load resistor 85 to the source of potential +V. The single ending or third stage of the amplifier consists of a pair of transistors 91 and 92. It should be noted that the transistors 91 and 92 are respectively an NPN and PNP transistor. The emitters of the two transistors 91 and 92 are interconnected by means of a resistor 93. The collector of the transistor 91 is returned to the source of potential +V. The base of the transistor 91 is connected to receive the output signal from transistor 81 while the base of the transistor 92 is connected to receive the output signal from the transistor 82 through the use of an emitter-follower circuit consisting of the transistor 94 having the resistor 95 connected between the emitter of the transistor 94 and a point of fixed potential such as ground. The collector of the transistor 94 is connected to the source of potential +V while the base thereof is connected to the collector of the transistor 82. The single ending stage 21 is utilized to convert the output signals from the collectors of the second differential amplifier illustrated as stage 18 into a single signal. This single signal appears at the collector of the transistor 92 and is applied to the base of the transistor 101 which is an emitter follower having its collector connected to the source of potential +V and its emitter connected through a resistor 102 to a second source of potential indicated at —V. The emitter of the transistor 101 is also connected to the base of transistor 103 which is the output amplifier. The emitter of the transistor 103 is connected to the source of potential —V while the collector thereof is connected through a load resistor 104 to the source of potential +V. The output signal from the amplifier appears across the output terminals 105. The output signal which is developed across terminals 105 is applied by way of lead 106 to the input terminal 41 and is utilized as one of the input signals to the amplifier. The signal to which this output is to be compared is then applied to the input terminal 42. Any difference existing between the input signal applied to the terminal 42 and the feedback signal applied to the terminal 41 will cause an operation in the circuit which is as follows: Assuming that the signal applied to input terminal 42 is greater than the feedback signal applied to the input terminal 41 and further assuming that the circuit has been adjusted in accordance with the procedure set out above, then transistor 35 will be caused to conduct more heavily. Since the current flow through the emitter circuit of the two transistors 31 and 35 is constant, the current flow through the transistor 31 will decrease. This in turn will cause the voltage drop appearing across resistor 46 to increase while the voltage drop appearing across resistor 45 will decrease. The voltage appearing in the collector of transistor 35 will therefore decrease, causing the current flow through transistor 82 to decrease. Simultaneously therewith the voltage appearing at the collector of transistor 31 will increase causing the current flow through the transistor 81 to increase.

Since again the two emitters of transistors 81 and 82 are interconnected the current flow through the emitter circuit consisting of resistor 83 is constant. This in turn causes the voltage drop appearing across the collector load resistors 84 and 85 respectively of the transistors 81 and 82 to vary. The voltage drop across the load resistor 84 increases causing the voltage appearing at the base of transistor 91 to decrease while the voltage appearing across the resistor 85 decreases, causing the voltage to appear at the base of transistor 94 to increase. As above pointed out, transistor 94 is an emitter follower which merely applies the signal appearing at its base to the base of transistor 92.

The signal thus appearing at the base of transistor 91 becomes less in magnitude while the signal appearing at the base of transistor 92 becomes greater in magnitude. This causes the current flow through resistor 96 to decrease thus causing the output signal appearing at terminals 105 to also decrease in magnitude. The decreased output signal is then applied by way of the feedback network to the input terminal 41 connected to the base of the transistor 31, thus causing the two input signals to become more nearly equal.

If the signal applied to the input terminal 42 decreases in magnitude, the operation will be quite similar to that above described with the results at each point merely reversed.

Although it is quite obvious that the operation of the circuit as disclosed in FIG. 4 is quite standard, it should be expressly understood that an assumption was made at the beginning of the discussion, that is, that the input stage 11 had been adjusted in accordance with the methods set forth above. An important consideration that should be borne in mind is that upon the adjustment of the input stage 11 in the manner above described the temperature drift errors that would otherwise appear without the following of this method are substantially for the first stage 11 and reduced for the remainder of the direct current amplifier as disclosed in FIG. 4 by the gain of the first stage. The same procedure may be used for each stage if desired to even further reduce the drift error signals. As a result of the substantial elimination of the temperature drift error under quiescent conditions by setting the emitter-base voltage drops of the input transistors 31 and 35 substantially equal, the operation of the direct current amplifier as disclosed in FIG. 4 is such that the error introduced as a result of the variation in ambient temperature does not exceed 2 microvolts per degree centigrade variation. By way of comparison the same circuit without following the procedure above set forth operates with an error signal of 10 microvolts per degree centigrade.

There has thus been disclosed a direct current amplifier having an input stage which is simple, inexpensive, and readily and easily internally adjusted to provide substantially zero temperature coefficient compensation. There has also been disclosed a method of adjustment for accomplishing such results.

What is claimed is:

1. The method of adjusting a direct-current transistor amplifier to have a substantially zero temperature drift coefficient, said amplifier having one stage which includes first and second transistors having unequal characteristics each having an emitter, a collector, and a base, and a resistive impedance element connected between said emitters, said method comprising the steps of:

(1) Applying an input signal to said stage,
   (a) said input signal having a fixed predetermined value;
(2) Setting $V_{BE1}$ substantially equal to $V_{BE2}$, where
   (a) $V_{BE1}$ is the voltage drop between the base and emitter of one of said transistors, and
   (b) $V_{BE2}$ is the voltage drop between the base and emitter of the other of said transistors; and
(3) Adjusting at least one circuit element in said amplifier until the output voltage thereof reaches a predetermined value corresponding to said predetermined fixed input signal.

2. The method as defined in claim 1 in which said predetermined fixed value of said input signal is zero.

3. The method of adjusting a direct-current transistor amplifier to have a substantially zero temperature drift coefficient, said amplifier having one stage which includes first and second transistors having unequal characteristics each having an emitter, a collector, and a base, a resistive impedance element connected between said emitters, and resistance in the collector circuit of each transistor, said method comprising the steps of:

(1) Applying an input signal to said stage,
   (a) said input signal having a fixed predetermined value;
(2) Setting $V_{BE1}$ substantially equal to $V_{BE2}$, where
   (a) $V_{BE1}$ is the voltage drop between the base and emitter of one of said transistors, and
   (b) $V_{BE2}$ is the voltage drop between the base and emitter of the other of said transistors; and (3) Varying the resistance appearing in the collector circuit of one of said transistors until the output voltage of said amplifier reaches a predetermined value corresponding to said predetermined fixed input signal.

4. The method of adjusting a direct-current transistor amplifiers to have a substantially zero temperature drift coefficient, said amplifier having one stage which includes first and second transistors having unequal characteristics each having an emitter, a collector, and a base, a resistive impedance element connected between said emitters, and resistance in the collector circuit of each transistor, said method comprising the steps of:

(1) Connecting the base electrodes of said transistors directly together thereby to apply a zero value input signal to said amplifier;

(2) Setting $V_{BE1}$ substantially equal to $V_{BE2}$, where (a) $V_{BE1}$ is the voltage drop between the base and emitter of one of said transistors, and (b) $V_{BE2}$ is the voltage drop between the base and emitter of the other of said transistors; and (3) Varying the resistance appearing in the collector circuit of one of said transistors until the output voltage of said amplifier reaches a predetermined value corresponding to said predetermined fixed input signal.

5. The method of adjusting a direct current transistor amplifier to have a substantially zero temperature drift coefficient, said amplifier having one stage which includes first and second transistors having unequal characteristics each having an emitter, a collector, and a base, a resistive impedance element connected between each of said emitters and the juncture therebetween connected variably to a common reference point, and resistance in the collector circuit of each transistor, said method comprising the steps of:

(1) Connecting the base electrodes of said transistors directly together thereby to apply a zero value input signal to said amplifier;

(2) Establishing the resistive impedance element between the emitters of said transistors at a first predetermined value;

(3) Varying the resistance appearing in the collector circuit of one of said transistors until the output voltage of said amplifier reaches a predetermined value corresponding to said zero input signal;

(4) Changing the resistive impedance element between the emitters of said transistors to a second predetermined value; and (5) Varying the relative value of resistance appearing between the emitter of each transistor and said common point until the output voltage of said amplifier reaches said predetermined value corresponding to said zero input signal.

References Cited by the Examiner

UNITED STATES PATENTS

| | | | |
|---|---|---|---|
| 3,003,113 | 10/61 | MacNichol | 330—69 |
| 3,077,566 | 2/63 | Vosteen | 330—31 X |

OTHER REFERENCES

Hilbiber: "A New D.C. Transistor Differential Amplifier," Fairchild Technical Articles and Papers, February 15, 1961, pp. 1–10.

Middlebrook and Taylor: "Differential Amplifier With Regulator Achieves High Stability, Low Drift," Electronics," July 28, 1961, pp. 56–59.

ROY LAKE, *Primary Examiner.*

NATHAN KAUFMAN, *Examiner.*